United States Patent
Mengel et al.

(10) Patent No.: US 8,531,014 B2
(45) Date of Patent: Sep. 10, 2013

(54) METHOD AND SYSTEM FOR MINIMIZING CARRIER STRESS OF A SEMICONDUCTOR DEVICE

(75) Inventors: Manfred Mengel, Bad Abbach (DE); Oliver Eichinger, Regensburg (DE); Khalil Hosseini, Weihmichl (DE); Joachim Mahler, Regensburg (DE)

(73) Assignee: Infineon Technologies AG, Neubiberg (DE)

( * ) Notice: Subject to any disclaimer, the term of this patent is extended or adjusted under 35 U.S.C. 154(b) by 334 days.

(21) Appl. No.: 12/890,722

(22) Filed: Sep. 27, 2010

(65) Prior Publication Data

US 2012/0074568 A1    Mar. 29, 2012

(51) Int. Cl.
*H01L 23/495* (2006.01)
*H01L 23/34* (2006.01)
*H01L 29/40* (2006.01)

(52) U.S. Cl.
USPC ............................ 257/668; 257/720; 257/778

(58) Field of Classification Search
USPC .......................................... 257/668, 720, 778
See application file for complete search history.

(56) References Cited

U.S. PATENT DOCUMENTS

| | | | | |
|---|---|---|---|---|
| 3,824,433 A * | 7/1974 | Newton, Jr. | .................. | 361/805 |
| 4,907,127 A * | 3/1990 | Lee | .................. | 361/748 |
| 5,019,209 A * | 5/1991 | Hiraide et al. | .................. | 216/14 |
| 5,402,004 A * | 3/1995 | Ozmat | .................. | 257/717 |
| 5,438,166 A * | 8/1995 | Carey et al. | .................. | 174/261 |
| 5,854,093 A * | 12/1998 | McBride | .................. | 438/106 |
| 6,018,459 A * | 1/2000 | Carlson et al. | .................. | 361/704 |
| 6,114,005 A * | 9/2000 | Nagai et al. | .................. | 428/114 |
| 6,124,637 A * | 9/2000 | Freyman et al. | .................. | 257/736 |
| 6,150,195 A * | 11/2000 | Chiu et al. | .................. | 438/118 |
| 6,191,482 B1 * | 2/2001 | Senba et al. | .................. | 257/737 |
| 6,204,559 B1 * | 3/2001 | Lin et al. | .................. | 257/738 |
| 6,215,076 B1 * | 4/2001 | Inagawa et al. | .................. | 174/261 |
| 6,245,442 B1 * | 6/2001 | Towata et al. | .................. | 428/614 |
| 6,329,606 B1 * | 12/2001 | Freyman et al. | .................. | 174/260 |
| 6,455,923 B1 * | 9/2002 | Jiang et al. | .................. | 257/676 |
| 6,523,608 B1 * | 2/2003 | Solbrekken et al. | .................. | 165/185 |
| 6,613,988 B2 * | 9/2003 | Powers | .................. | 174/261 |
| 2005/0001308 A1 * | 1/2005 | Silverbrook | .................. | 257/697 |
| 2005/0032273 A1 * | 2/2005 | Chang et al. | .................. | 438/108 |
| 2005/0104197 A1 * | 5/2005 | Houle et al. | .................. | 257/706 |
| 2006/0220227 A1 * | 10/2006 | Marro | .................. | 257/723 |
| 2007/0080436 A1 * | 4/2007 | Chun et al. | .................. | 257/668 |
| 2007/0125571 A1 * | 6/2007 | Casasnovas et al. | .................. | 174/260 |
| 2007/0176300 A1 * | 8/2007 | Sota | .................. | 257/778 |
| 2008/0310115 A1 * | 12/2008 | Brandenburg et al. | .................. | 361/704 |
| 2010/0237496 A1 * | 9/2010 | Touzelbaev et al. | .................. | 257/712 |
| 2011/0096507 A1 * | 4/2011 | Deram | .................. | 361/718 |
| 2011/0170231 A1 * | 7/2011 | Chandrasekaran et al. | .................. | 361/306.1 |
| 2011/0175237 A1 * | 7/2011 | Tomura et al. | .................. | 257/778 |

* cited by examiner

*Primary Examiner* — James Mitchell

(57) ABSTRACT

A method and a system for minimizing carrier stress of a semiconductor device are provided. In one embodiment, a semiconductor device is provided comprising a carrier comprising a mesh coated with a metallic material, and a semiconductor chip disposed over the carrier.

24 Claims, 4 Drawing Sheets

US 8,531,014 B2

METHOD AND SYSTEM FOR MINIMIZING CARRIER STRESS OF A SEMICONDUCTOR DEVICE

TECHNICAL FIELD

The present invention relates generally to a semiconductor device. In particular, the present disclosure relates to a method and system for minimizing carrier stress of a semiconductor device.

BACKGROUND

Semiconductor chips are typically disposed on a metallic carrier, such as a copper carrier, by solder or glue. However, the thermal properties between the semiconductor chips and the metallic carrier are very different. For example, the thermal coefficient of expansion (CTE) of silicon chips is much less than the CTE of copper during the cooling process. This leads to increased thermo-mechanical tension between the chips and the carrier, which results in breakage in the silicon. The difference in thermal-mechanical properties also causes a strong bending of the carrier substrate, which makes subsequent processing of the semiconductor, such as laser drilling, lamination, wire bonding, etc., difficult. Therefore, a need exists for a method and system that minimize carrier stress of a semiconductor device.

SUMMARY OF INVENTION

Figure 1:
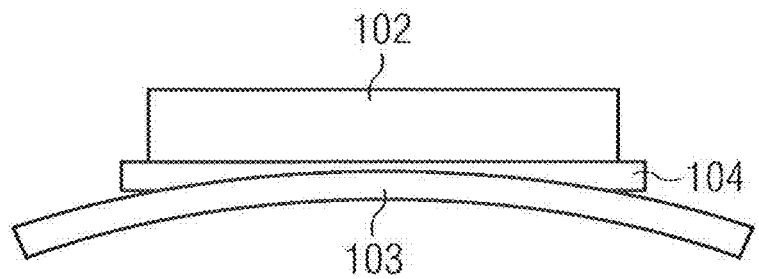
FIG. 1 is a diagram illustrating a semiconductor device with thermal-mechanical stress in accordance with prior art.

The present disclosure provides a semiconductor device with minimized carrier stress. In one embodiment, the semiconductor device comprises a carrier comprising a mesh and a metallic material, and a semiconductor chip disposed over the carrier.

A method for minimizing carrier stress is also provided. The method comprises providing a mesh comprising a plurality of hollow spaces, disposing a semiconductor chip over the mesh, and disposing metallic material over the mesh to fill the plurality of hollow spaces.

DETAILED DESCRIPTION

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

It is to be understood that the features of the various exemplary embodiments described herein may be combined with each other, unless specifically noted otherwise.

Devices with semiconductor chips are described below. The semiconductor chips may be of extremely different types, may be manufactured by different technologies and may include for example, integrated electrical or electro-optical circuits or passives or MEMS etc. Semiconductor chips may be configured, for example, as power transistors, power diodes, IGBTs (Isolated Gate Bipolar Transistors). Semiconductor chips may have a vertical structure and may be fabricated in such a way that electrical currents can flow in a direction perpendicular to the main surfaces of the semiconductor chips. These semiconductor chips may have contact elements disposed on its main surfaces, which includes a top surface and a bottom surface. Examples of semiconductor chips having a vertical structure include power transistors and power diodes. In case of power transistors, the source electrode and the gate electrode may be disposed on a first main surface while the drain electrode may be disposed on a second main surface. In case of a power diode, the anode electrode may be disposed on a first main surface while the cathode electrode may be disposed on a second main surface.

The integrated circuits may, for example, be designed as logic integrated circuits, analog integrated circuits, mixed signal integrated circuits, power integrated circuits, memory circuits or integrated passives. Furthermore, the semiconductor chips may be configured as MEMS (micro-electro mechanical systems) and may include micro-mechanical structures, such as bridges, membranes or tongue structures. The semiconductor chips may be configured as sensors or actuators, for example, pressure sensors, acceleration sensors, rotation sensors, microphones etc. The semiconductor chips may be configured as antennas and/or discrete passives. The semiconductor chips may also include antennas and/or discrete passives. Semiconductor chips, in which such functional elements are embedded, generally contain electronic circuits which serve for driving the functional elements or further process signals generated by the functional elements. The semiconductor chips need not be manufactured from specific semiconductor material and, furthermore, may contain inorganic and/or organic materials that are not semiconductors, such as for example, discrete passives, antennas, insulators, plastics or metals. Moreover, the semiconductor chips may be packaged or unpackaged.

The semiconductor chips have contact elements which allow electrical contact to be made with the semiconductor chips. The contact elements may be composed of any desired electrically conductive material, for example, of a metal, such as aluminum, nickel, palladium, gold or copper, a metal alloy, a metal stack or an electrically conductive organic material. The contact elements may be situated on the active main surfaces of the semiconductor chips or on other surfaces of the semiconductor chips. The active or passive structures of the semiconductor chips are usually arranged below the active main surfaces and can be electrically contacted via the contact elements. In case of power transistors, the contact elements may be drain, source or date electrodes.

The devices described in the following may include external contact elements that are accessible from outside of the devices to allow electrical contact to be made from outside of the devices. In addition, the external contact elements may be thermally conductive and serve as heat sinks for heat dissipation of the semiconductor chips. The external contact elements may be composed of any electrically conductive material, for example, a metal such as copper, Pd, Ni, Au, etc.

The devices described in the following may include an encapsulating material covering at least parts of the semiconductor chips. The encapsulating material is an electrically insulating material, which is at most marginally electrically conductive relative to the electrically conductive components of the device. Examples of an encapsulating material include a mold material and an epoxy based material. The encapsulating material may be any appropriate duroplastic, thermoplastic, laminate (prepreg) or thermosetting material and may contain filler materials. Various techniques may be employed to cover the semiconductor chips with the mold material, for example, compression molding, lamination or injection molding.

Referring to FIG. 1, a diagram illustrating a semiconductor device with thermal-mechanical stress is depicted in accordance with prior art. A semiconductor chip 102 is disposed over a carrier 103. The semiconductor chip 102 may be made of silicon or other types of semiconductor material. Carrier 103 may be made of metals, such as copper. Semiconductor chip 102 may be disposed using soldering material or adhesive material.

The soldering material or adhesive material 104 is typically heated to a high temperature, such as between 200 and 300 degrees Celsius, when the semiconductor chip 102 is attached. However, during cooling of the soldering or adhesive material, the coefficients of thermal expansion (CTE) of silicon of the semiconductor chip 102 and carrier 103 are very different from one another. For example, the CTE of silicon is about 2.5 ppm/K and the CTE of copper is about 16.5 ppm/K. This leads to breakage of the silicon in the semiconductor chip 102 especially if the semiconductor chip is less than 100 micrometers thick. The difference in CTEs also leads to bending of the carrier substrate 103 which makes subsequent processing of semiconductor chip 102 difficult and reduces reliability of the overall device.

The present disclosure provides a method and system for minimizing carrier stress of a semiconductor device. A mesh is provided as part of the carrier for the semiconductor chip. In one embodiment, the mesh is arranged in a grid form. The mesh comprises a plurality of hollow spaces. After the semiconductor chip is attached to the mesh, the plurality of hollow spaces are filled with a metallic material. This provides a sturdy metallic grid on the back surface of the semiconductor chip. The grid minimizes therm-mechanical stress generated during the cooling process between the chip and the carrier.

Figure 2:
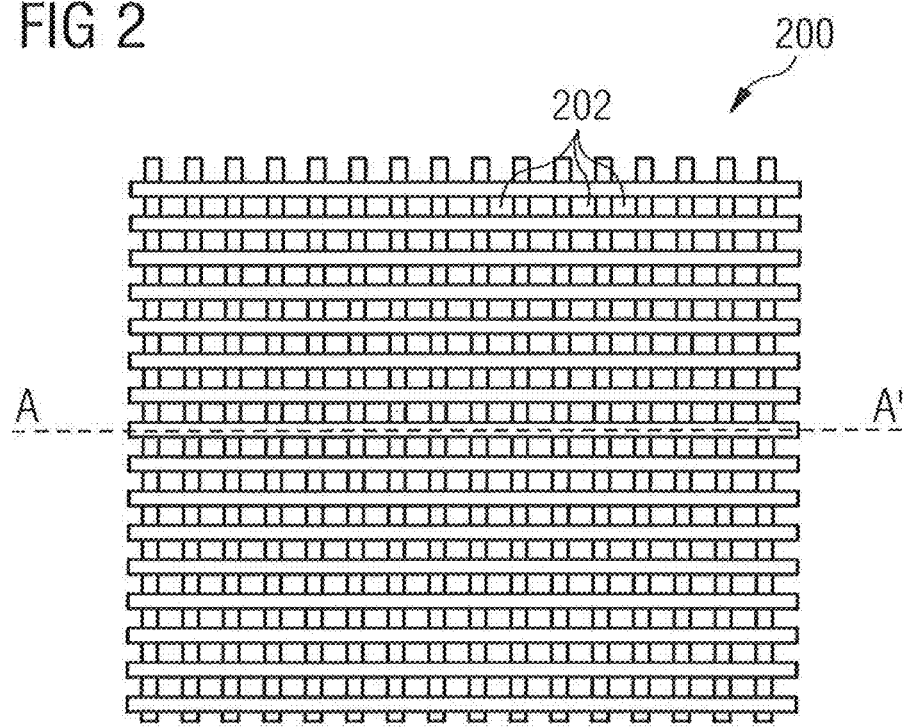
FIG. 2 is a diagram of a top view of an exemplary mesh for minimizing carrier stress of a semiconductor device in accordance with one embodiment of the present disclosure.

Referring to FIG. 2, a diagram of a top view of an exemplary mesh for minimizing carrier stress of a semiconductor device is depicted in accordance with one embodiment of the present disclosure. In this embodiment, a mesh 200 is provided in a carrier, such as carrier 103. Mesh 200 may be formed in various formats, for example, in a grid format as shown in FIG. 2. In a grid format, mesh 200 is arranged in a plurality of columns and rows. However, mesh 200 may be arranged in formats other than a grid format without departing the spirit and scope of the present disclosure. For example, mesh 200 may be arranged in a web format with irregular shapes. Thus, the plurality of columns and rows may be woven together like a web with connections one another. In addition, the plurality of columns and rows may be arranged in more than one layer as shown in FIG. 2, for example, the plurality of columns may be arranged above or below the plurality of rows.

A plurality of hollow spaces 202 are formed between the plurality of rows and columns of mesh 200. The hollow spaces 202 are later filled with a metallic material. Furthermore, mesh 200 may be coated in a single application with metallic material to improve adhesion to the metallic material of the carrier 103. For example, mesh 200 may be coated with an adhesion promoter of an organic type or a metallic surface finish. In this way, mesh 200 is better adhered to the carrier 103.

Figure 3:
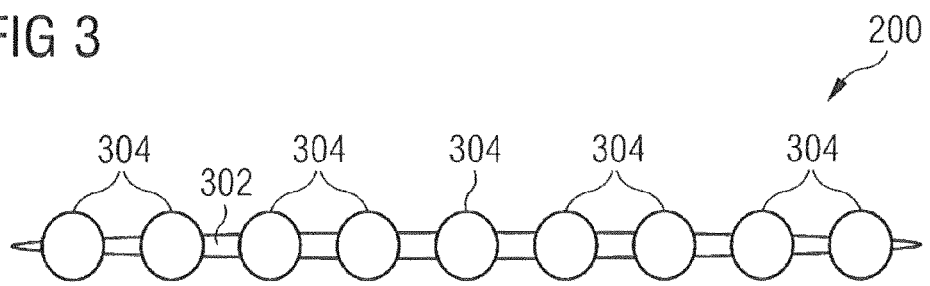
FIG. 3 is a diagram of a cross section of an exemplary mesh for minimizing carrier stress of a semiconductor device in accordance with one embodiment of the present disclosure.

Referring to FIG. 3, a diagram of a cross section of an exemplary mesh for minimizing carrier stress of a semiconductor device is depicted in accordance with one embodiment of the present disclosure. In FIG. 3, a cross section (line A-A') of mesh 200 from FIG. 2 is shown. Mesh 200 comprises a grid with at least one row 302 and at least one column 304. Mesh 200 may be made of fibrous material or metallic materials, such as copper or steel. The at least one row 302 and at least one column 304 may have same or different diameters. The diameters of the at least one row 302 and at least one column 304 are preferably in the micrometer range. For example, the diameter of at least one row 302 and at least one column 304 is about 25 micrometers.

Figure 4A:
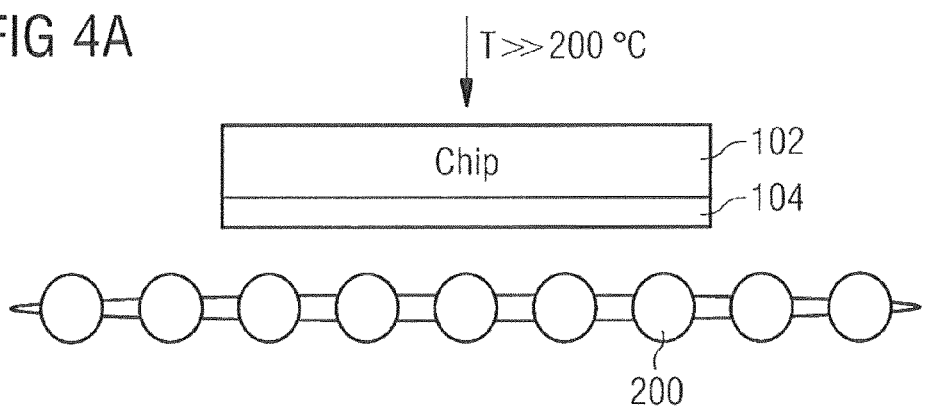
FIGS. 4A-4C are diagrams illustrating a process of minimizing carrier stress of a semiconductor device in accordance with one embodiment of the present disclosure.
Figure 4B:
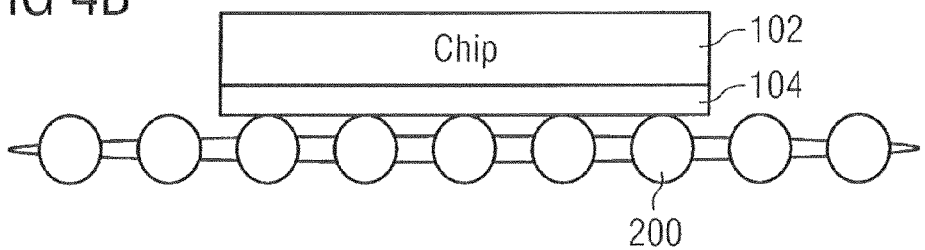
Figure 4C:
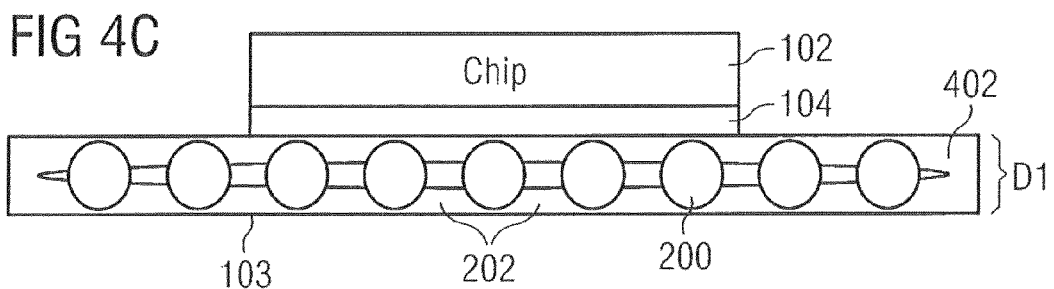

Referring to FIGS. 4A-4C, diagrams illustrating a process of minimizing carrier stress of a semiconductor device are depicted in accordance with one embodiment of the present disclosure. In FIG. 4A, semiconductor chip 102 is disposed over mesh 200 under high temperature. For example, semiconductor chip 102 is soldered or glued to mesh 200 using soldering or adhesive material 104 under temperature greater than 200 degrees Celsius. In one example, the soldering material 104 may be a gold-plated alloy such as AuSn. The semiconductor chips 102 may be soldered to mesh 200 by diffusion soldering.

In FIG. 4B, the semiconductor chip 102 and the mesh 200 are cooled at room temperature after semiconductor chip 102 is disposed. As shown in FIG. 4B, no bending or curvature of mesh 200 is encountered during the cooling process due to the formation of the mesh. For example, the grid format of mess 200 provides a mechanical lattice effect for the structure.

In FIG. 4C, a metallic material 402 is disposed to coat the mesh 200 and form carrier 103. The metallic material 402 may be galvanically deposited over mesh 200 to fill the plurality of hollow spaces 202 between the at least one row 302 and at least one column 204 of the grid. Alternatively, a metallic paste may be applied to fill the plurality of hollow spaces 202. Examples of the metallic material 402 include copper and silver. The thickness D1 of deposited metallic material 402 is also preferably in the micrometer range, for example, about 25 micrometers.

Carrier 103 with metallic material 402 provides a sturdy metallic structure for subsequent processing, for example, laser drilling, lamination, wire bonding, etc. With mesh 200 and metallic material 402, the thermal-mechanical stress between semiconductor chip 102 and carrier 103 is reduced. The bending or curvature of the carrier 103 after attachment of semiconductor chip 102 is also minimized. The metallic material 402 also provides a better adhesion to semiconductor chip 102 on the backside. Thus, the reliability of the overall device is improved with minimized carrier stress.

Figure 5:
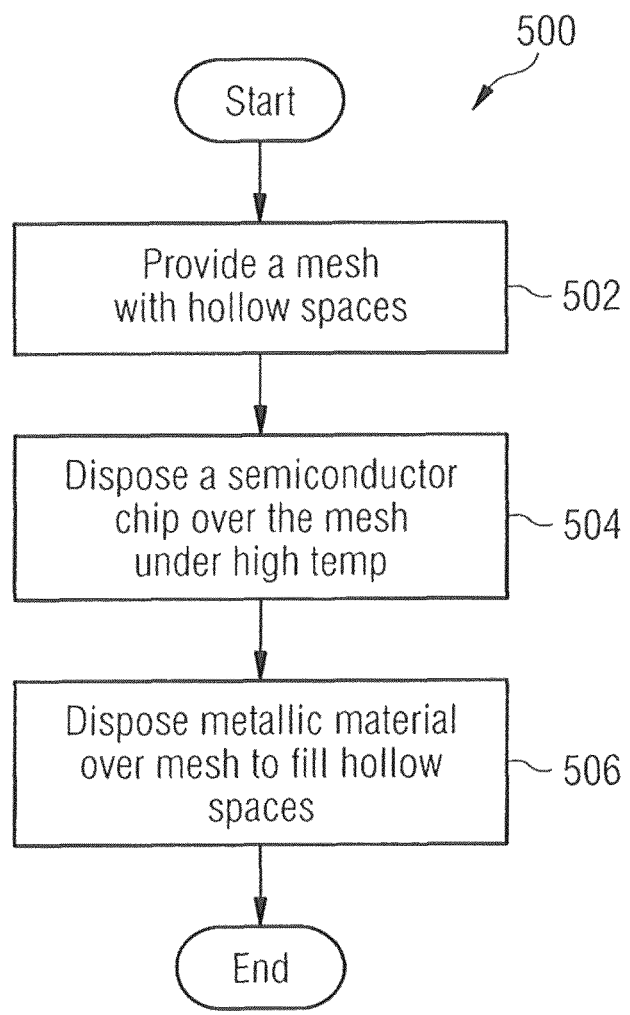
FIG. 5 is a flowchart of an exemplary process for minimizing carrier stress in accordance with one embodiment of the present disclosure.

Referring to FIG. 5, a flowchart of an exemplary process for minimizing carrier stress is depicted in accordance with one embodiment of the present disclosure. Process 500 begins at step 502 to provide a mesh with a plurality of hollow spaces. For example, mesh 200 is provided with a grid comprising at least one row 302 and at least one column 304 and a plurality of hollow spaces 202 between the at least one row 302 and at least one column 304.

Next, process 500 continues to step 504 to dispose a semiconductor chip over the mesh under high temperature. For example, semiconductor chip 102 is disposed over mesh 200 using soldering or adhesive material under temperature of greater than about 200 degrees. Process 500 then completes at step 506 to dispose metallic material over the mesh to fill the hollow spaces. For example, metallic material 402 made of silver or copper is disposed over mesh 200 to fill the plurality of hollow spaces 202 and form carrier 103. The metallic material 402 may be galvanically deposited in the plurality of hollow spaces 202 or a metallic paste may be applied to populate the plurality of hollow spaces 202 in mesh 200.

Figure 6A:
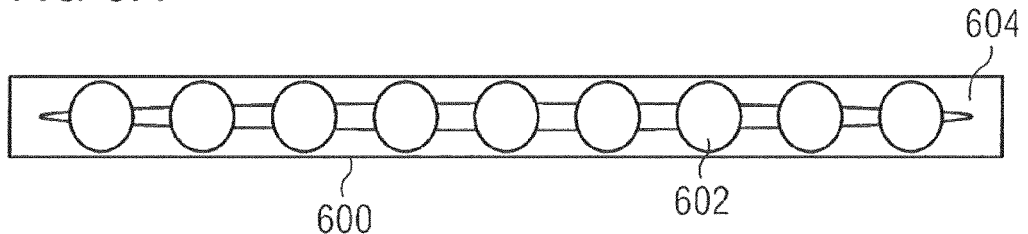
FIGS. 6A-6B are diagrams illustrating a process of minimizing carrier stress of a semiconductor device in accordance with an alternative embodiment of the present disclosure.
Figure 6B:
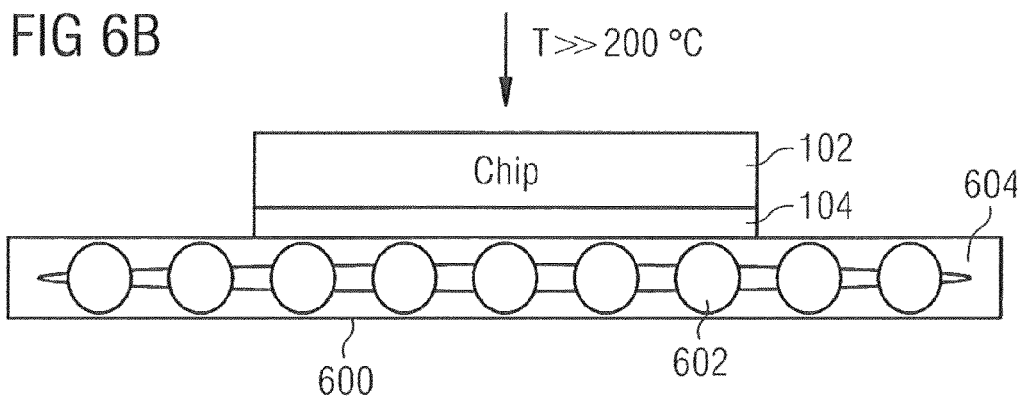

Referring to FIGS. 6A-6B, diagrams illustrating a process of minimizing carrier stress of a semiconductor device are depicted in accordance with an alternative embodiment of the present disclosure. In FIG. 6A, a carrier 600 is provided with an embedded mesh 602. Mesh 602 is embedded in carrier 600 with metallic material 604, such as copper or silver. Mesh 600 may be embedded in carrier 600 by galvanic deposition. Alternatively, a metallic paste may be applied to embed mesh 600.

Referring to FIG. 6B, semiconductor chip 102 is then disposed over carrier 600 with embedded mesh 602 under high temperature. For example, semiconductor chip 102 is soldered or glued to carrier 600 with embedded mesh 602 using soldering or adhesive material 104 under temperature greater than 200 degrees Celsius. In one example, the soldering material 104 may be a gold-plated alloy such as AuSn. The semiconductor chips 102 may be soldered to carrier 600 with embedded mesh 602 by diffusion soldering. By providing a carrier with embedded mesh 602, manufacturing cost may be lowered with a larger die area.

Figure 7:
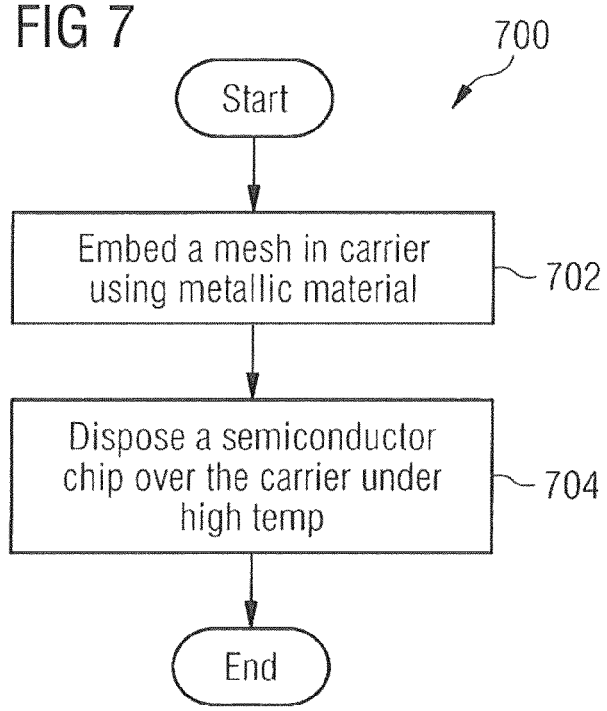
FIG. 7 is a flowchart of an exemplary process for minimizing carrier stress in accordance with an alternative embodiment of the present disclosure.

Referring to FIG. 7, a flowchart of an exemplary process for minimizing carrier stress is depicted in accordance with an alternative embodiment of the present disclosure. Process 700 begins at step 702 to embed a mesh in a carrier using metallic material. For example, mesh 602 may be embedded in carrier 600 by galvanically depositing metallic material 604 over mesh 602. Alternatively, a metallic paste 604 may be applied over mesh 602 to embed it within carrier 600.

Next, process 700 completes at step 704 to dispose a semiconductor chip over the carrier under high temperature. For example, semiconductor chip 102 is disposed over carrier 600 with embedded mesh 602 using soldering or adhesive material under temperature of greater than about 200 degrees.

In addition, while a particular feature or aspect of an embodiment of the invention may have been disclosed with respect to only one of several implementations, such feature or aspect may be combined with one or more other features or aspects of the other implementations as may be desired and advantageous for any given or particular application. Furthermore, to the extent that the terms "include", "have", "with", or other variants thereof are used in either the detailed description or the claims, such terms are intended to be inclusive in a manner similar to the term "comprise". The terms "coupled" and "connected", along with derivatives may have been used. It should be understood that these terms may have been used to indicate that two elements co-operate or interact with each other regardless whether they are in direct physical or electrical contact, or they are not in direct contact with each other. Furthermore, it should be understood that embodiments of the invention may be implemented in discrete circuits, partially integrated circuits or fully integrated circuits or programming means. Also, the term "exemplary" is merely meant as an example, rather than the best or optimal. It is also to be appreciated that features and/or elements depicted herein are illustrated with particular dimensions relative to one another for purposes of simplicity and ease of understanding, and that actual dimensions may differ substantially from that illustrated herein.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed:

1. A semiconductor device comprising:
   a carrier comprising a mesh made of a first metallic material and coated with a second metallic material; and
   a semiconductor chip disposed over the carrier;
   wherein the mesh is at least substantially the size of the semiconductor chip and the second metallic material fills the entire mesh and completely surrounds the entire first metallic material.

2. The semiconductor device of claim 1, wherein the first metallic material is a steel or copper.

3. The semiconductor device of claim 1, wherein the mesh comprises a grid with at least one row and at least one column.

4. The semiconductor device of claim 3, wherein diameter of the at least one row or the at least one column is about 25 micrometers.

5. The semiconductor device of claim 3, wherein a plurality of hollow spaces are formed between the at least one row and the at least one column.

6. The semiconductor device of claim 5, wherein the second metallic material is disposed over the mesh and fills the plurality of hollow spaces.

7. The semiconductor device of claim 5, wherein the second metallic material is galvanically deposited in the plurality of hollow spaces.

8. The semiconductor device of claim 5, wherein a metallic paste is applied over the mesh to fill the plurality of hollow spaces.

9. The semiconductor device of claim 1, wherein the semiconductor chip is soldered to the carrier by diffusion soldering.

10. The semiconductor device of claim 9, wherein the semiconductor chip is soldered to the carrier using a soldering material with gold plated alloy.

11. The semiconductor device of claim 1, wherein the second metallic material is copper or silver.

12. The semiconductor device of claim 1, wherein a thickness of the second metallic material is about 25 micrometers.

13. A method of minimizing carrier stress of a semiconductor device comprising:
    providing a mesh comprising a first metallic material defining a plurality of hollow spaces;
    disposing a semiconductor chip over the mesh, the mesh is at least substantially the size of the semiconductor chip; and
    disposing a second metallic material over the mesh to fill the plurality of hollow spaces, wherein the second metallic material fills the entire mesh and completely surrounds the entire first metallic material.

14. The method of claim 13, wherein providing the mesh comprising the first metallic material defining the plurality of hollow spaces comprises:
   forming a grid with at least one row and one column.

15. The method of claim 13, wherein disposing the semiconductor chip over the mesh comprises:
   disposing the semiconductor chip over the mesh under high temperature.

16. The method of claim 13, wherein disposing the second metallic material over the mesh to fill the plurality of hollow spaces comprises:
   galvanically depositing the second metallic material in the plurality of hollow spaces.

17. The method of claim 13, wherein disposing the second metallic material over the mesh to fill the plurality of hollow spaces comprises:
   applying a metallic paste over the mesh to fill the plurality of hollow spaces.

18. The method of claim 13, wherein disposing the semiconductor chip over the mesh comprises:
   soldering the semiconductor chip to the carrier by diffusion soldering.

19. A semiconductor device comprising:
   a carrier comprising a grid made from a first metallic material and filled entirely with a second metallic material the second metallic material surrounding the entire first metallic material; and
   a semiconductor chip disposed over the carrier;
   wherein the mesh is at least substantially the size of the semiconductor chip.

20. A method of minimizing carrier stress of a semiconductor device comprising:
   embedding an entire mesh made from a first metallic material in a carrier with a second metallic material the second metallic material surrounding the entire first metallic material; and
   disposing a semiconductor chip over the carrier;
   wherein mesh is at least substantially the size of the semiconductor chip.

21. The method of claim 20, wherein embedding the mesh in the carrier with the second metallic material comprises:
   providing the mesh;
   galvanically depositing the second metallic material over the mesh.

22. The method of claim 21, wherein providing the mesh comprises:
   coating the mesh with an adhesion promoter of an organic type.

23. A method of minimizing carrier stress of a semiconductor device comprising:
   providing a mesh made from a first metallic material comprising a plurality of hollow spaces;
   disposing a semiconductor chip over the mesh, wherein the mesh is at least substantially the size of the semiconductor chip; and
   disposing a second metallic material over the mesh to entirely fill the plurality of hollow spaces, the second metallic material surrounding the entire first metallic material;
   wherein disposing the semiconductor chip over the mesh comprises:
      disposing the semiconductor chip over the mesh under high temperature.

24. A method of minimizing carrier stress of a semiconductor device comprising:
   providing a mesh made from a first metallic material comprising a plurality of hollow spaces;
   disposing a semiconductor chip over the mesh, wherein the mesh is at least substantially the size of the semiconductor chip; and
   disposing a second metallic material over the mesh to entirely fill the plurality of hollow spaces, the second metallic material surrounding the entire first metallic material;
   wherein disposing the semiconductor chip over the mesh comprises:
      soldering the semiconductor chip to the carrier by diffusion soldering.

* * * * *